United States Patent
Seo et al.

(10) Patent No.: US 8,749,281 B2
(45) Date of Patent: Jun. 10, 2014

(54) PHASE DETECTION CIRCUIT AND SYNCHRONIZATION CIRCUIT USING THE SAME

(75) Inventors: Young Suk Seo, Icheon-si (KR); Jin Il Chung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,246

(22) Filed: Sep. 3, 2012

(65) Prior Publication Data

US 2014/0002150 A1 Jan. 2, 2014

(30) Foreign Application Priority Data

Jun. 29, 2012 (KR) ........................ 10-2012-0070726

(51) Int. Cl.
*H03L 7/18* (2006.01)
*H03L 7/093* (2006.01)

(52) U.S. Cl.
USPC ........................................ 327/156; 327/147

(58) Field of Classification Search
USPC .................................. 327/147, 156
See application file for complete search history.

(56) References Cited

U.S. PATENT DOCUMENTS

| | | | | |
|---|---|---|---|---|
| 6,259,290 | B1* | 7/2001 | Takada et al. | 327/158 |
| 6,853,223 | B2* | 2/2005 | Ebuchi et al. | 327/156 |
| 6,949,958 | B2* | 9/2005 | Zerbe et al. | 327/3 |
| 7,728,631 | B2* | 6/2010 | Nathawad | 327/12 |
| 7,818,526 | B2 | 10/2010 | Jang | |
| 8,031,015 | B2* | 10/2011 | Kimura et al. | 331/78 |
| 8,120,396 | B2* | 2/2012 | Iwane | 327/158 |
| 8,143,925 | B2* | 3/2012 | Ahn et al. | 327/158 |
| 8,169,241 | B2* | 5/2012 | Strazzieri et al. | 327/156 |
| 2003/0169836 | A1* | 9/2003 | Ebuchi et al. | 375/373 |
| 2007/0018699 | A1* | 1/2007 | Abbasi | 327/156 |
| 2008/0278248 | A1* | 11/2008 | Kimura et al. | 331/1 R |
| 2011/0032009 | A1* | 2/2011 | Iwane | 327/142 |
| 2012/0098570 | A1* | 4/2012 | Wang et al. | 327/7 |
| 2012/0154002 | A1* | 6/2012 | Ahn et al. | 327/158 |

FOREIGN PATENT DOCUMENTS

KR 1020090071015 A 7/2009

\* cited by examiner

*Primary Examiner* — Adam Houston

(74) *Attorney, Agent, or Firm* — William Park & Associates Patent Ltd.

(57) ABSTRACT

A phase detection circuit is configured to generate a phase detection signal by comparing a divided clock signal obtained by dividing a first clock signal to a second clock signal during a deactivation period of a control signal, and generate the phase detection signal by comparing the first and second clock signals during an activation period of the control signal.

17 Claims, 3 Drawing Sheets

PHASE DETECTION CIRCUIT AND SYNCHRONIZATION CIRCUIT USING THE SAME

CROSS-REFERENCES TO RELATED APPLICATION

The present application claims priority under 35 U.S.C. §119(a) to Korean application number 10-2012-0070726, filed on Jun. 29, 2012, in the Korean Intellectual Property Office, which is incorporated herein by reference in its entirety.

BACKGROUND

1. Technical Field

The present invention relates generally to a semiconductor circuit, and more particularly, to a phase detection circuit and a synchronization circuit using the same.

2. Related Art

A conventional synchronization circuit such as a phase locked loop (PLL) or delayed locked loop (DLL) determines whether a phase or delay time has been adjusted to a value within a desired range, or whether a delay lock or phase lock has been achieved, during a phase or delay time adjustment process.

The synchronization circuit may use a phase detection circuit to determine whether a delay lock or phase lock has been achieved.

The phase detection circuit compares a reference signal REFCLK to a comparison target signal FBCLK and generates a result signal PDOUT.

FIG. 1 is a waveform diagram to demonstrate a phase detection operation for the conventional synchronization circuit.

Referring to FIG. 1, when noise components such as jitter are contained in the reference signal REFCLK and the comparison target signal FBCLK, the phase detection circuit may output the result signal as an abnormal value.

When the phase detection circuit outputs the result signal PDOUT as an abnormal value, an operation error of the synchronization circuit may occur.

SUMMARY

A phase detection circuit capable of performing a stable operation regardless of noise and a synchronization circuit using the is same are described herein.

In an embodiment of the present invention, a phase detection circuit is configured to generate a phase detection signal by comparing a divided clock signal obtained by dividing a first clock signal to a second clock signal during a deactivation period of a control signal, and generate the phase detection signal by comparing the first and second clock signals during an activation period of the control signal.

In an embodiment of the present invention, a phase detection circuit includes: a division section configured to generate a divided clock signal by dividing a first clock signal; a multiplexing section configured to select and output the first clock signal or the divided clock signal in response to a control signal; and a detection section configured to compare the phase of the output signal of the multiplexing section to a second clock signal and generate a phase detection signal.

In an embodiment of the present invention, a synchronization circuit includes: a variable delay unit configured to generate a synchronization clock signal by delaying a reference clock signal by a varied delay time; a feedback clock signal generation unit configured to receive the synchronization clock signal and generate a feedback clock signal; a control unit configured to vary the delay time of the variable delay unit in response to a phase detection signal and generate a lock completion signal in response to the transition of the phase detection signal; and a phase detection unit configured to generate the phase detection signal by comparing either the reference clock signal or the divided reference clock signal to the feedback clock signal in response to the lock completion signal.

BRIEF DESCRIPTION OF THE DRAWINGS

Features, aspects, and embodiments are described in conjunction with the attached drawings, in which.

DETAILED DESCRIPTION

Hereinafter, a phase detection circuit and a synchronization circuit using the same according to the present invention will be described below with reference to the accompanying drawings through various embodiments.

Figure 1:
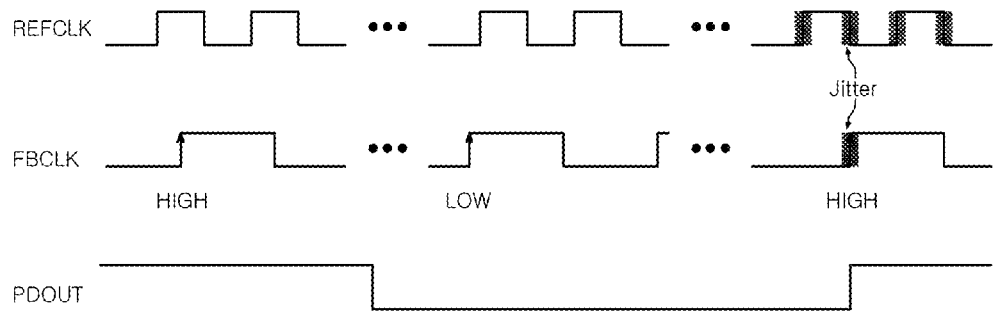
FIG. 1 is a waveform diagram demonstrating a phase detection operation of a conventional synchronization circuit.
Figure 2:
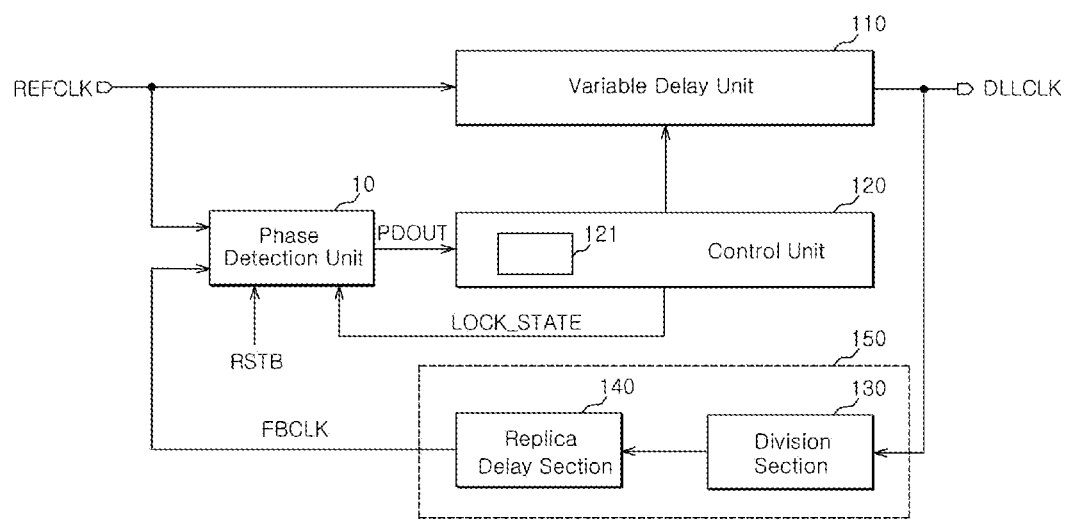
FIG. 2 is a block diagram of a synchronization circuit according to an embodiment of the present invention.

Referring to FIG. 2, a synchronization circuit 100 according to one embodiment of the present invention includes a variable delay unit 110, a control unit 120, a feedback clock signal generation unit 150, and a phase detection unit 10.

The feedback clock signal generation unit 150 includes a division section 130 and a replica delay section 140.

The variable delay unit 110 has a varied delay time in response to the control of the control unit 120, and is configured to delay a first clock signal, i.e., a reference clock signal REFCLK by the varied delay time and generate a synchronization clock signal DLLCLK.

The control unit 120 is configured to control the variable delay unit 110 in response to a phase detection signal PDOUT, and generate a lock completion signal LOCK_STATE in response to the transition of the phase detection signal PDOUT.

The control unit 120 for generating the lock completion signal LOCK_STATE in response to the transition of the phase detection signal PDOUT may include a lock state detector 121.

The division section 130 is configured to divide the synchronization clock signal DLLCLK by two.

The replica delay section 140 includes a delay element to replicate a delay time of a specific signal path.

The specific signal path may include an internal signal path through which an external clock signal passes in a circuit using the synchronization circuit 100, for example, a semiconductor memory circuit.

The phase detection unit 10 is configured to compare either the reference clock signal REFCLK or a signal obtained by dividing the reference clock signal REFCLK to a second clock signal, i.e., a feedback clock signal FBCLK in response to the lock completion signal LOCK_STATE and a reset signal RSTB and generate the phase detection signal PDOUT.

Figure 3:
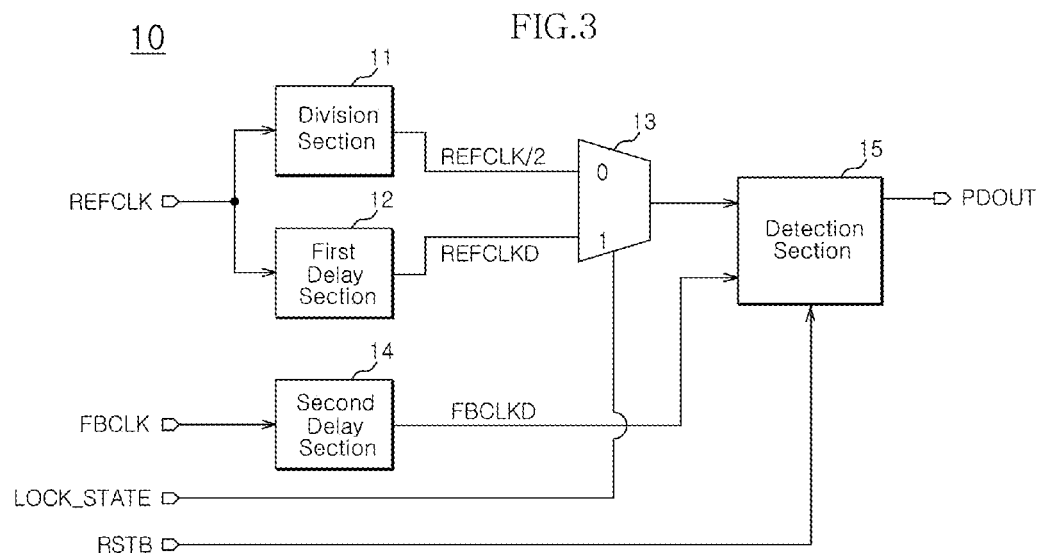
FIG. 3 is a block diagram of a phase detection unit of FIG. 2.

Referring to FIG. 3, the phase detection unit 10 includes a division section 11, a first delay section 12, a multiplexing section 13, a second delay section 14, and a detection section 15.

The division section 11 is configured to divide the reference clock signal REFCLK by two and generate the divided clock signal REFCLK/2.

The first delay section 12 is configured to delay the reference clock signal REFCLK by a preset time and generate the delayed reference clock signal REFCLKD.

The multiplexing section 13 is configured to select either the divided clock signal REFCLK/2 or the delayed reference clock signal REFCLKD in response to the lock completion signal LOCK_STATE.

The lock completion signal LOCK_STATE may include a signal that defines whether the delay lock of a DLL or the phase lock of a PLL has been completed.

In an embodiment of the present invention, the lock completion signal LOCK_STATE is used as a signal for controlling the phase detection unit 10. However, this is only an example, and a control signal provided from an external source instead of a DLL or PLL may be used.

The second delay section 14 is configured to delay a feedback clock signal FBCLK by a preset time and generate the delayed feedback clock signal FBCLKD.

The first delay section 12 may be configured as a dummy delay device to compensate for a delay time of a signal path passing through the division section 11.

The second delay section 14 may be configured as a dummy delay device to compensate for a delay time of a signal path passing through the multiplexing section 13 and either the division section 11 or the first delay section 12.

The detection section 15 is configured to compare the phase of the delayed feedback clock signal FBCLKD to the phase of an output signal of the multiplexing section 13 and generate the phase detection signal PDOUT.

The detection section 15 is configured to initialize the phase detection signal PDOUT in response to a reset signal RSTB.

The operation of the phase detection unit 10 according to an embodiment of the present invention will be described as follows.

The multiplexing section 13 selects the divided clock signal REFCLK/2 and provides the selected signal to the detection section 15, when the lock completion signal LOCK_STATE is deactivated (for example, low level).

The multiplexing section 13 provides the delayed reference clock signal REFCLKD to the detection section 15, when the lock completion signal LOCK_STATE is activated (for example, high level).

When the lock completion signal LOCK_STATE is deactivated, the detection section 15 outputs the phase detection signal PDOUT as a high level in the case where a rising edge of the feedback clock signal FBCLK substantially leads a rising edge of the divided clock signal REFCLK/2.

Actual input signals of the detection section 15 may include the output signals of the multiplexing section 13 and the second delay section 14. However, since the first and second delay sections 12 and 14 are dummy delay devices to compensate for an internal time delay, it may be understood that the detection section 15 effectively compares either the reference clock signal REFCLK or the divided clock signal REFCLK/2 to the feedback clock signal FBCLK.

When the lock completion signal LOCK_STATE is activated, the detection section 15 outputs the phase detection signal PDOUT as a high level in the case where the rising edge of the feedback clock signal FBCLK substantially leads a rising edge of the clock signal REFCLK.

In an embodiment of the present invention, when the lock completion signal LOCK_STATE is deactivated, the divided clock signal REFCLK/2 is used.

Figure 4:
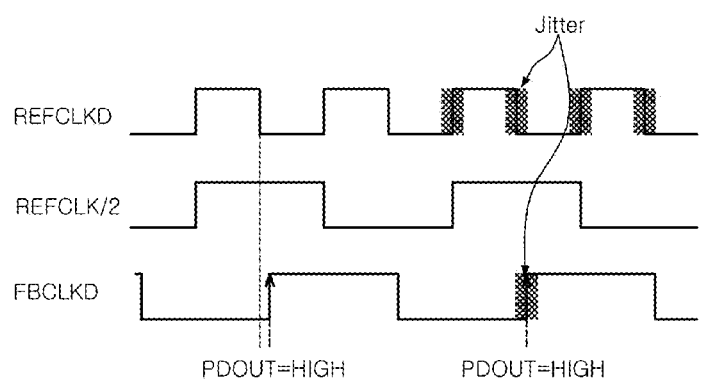
FIG. 4 is a timing diagram demonstrating the operation of the phase detection circuit of FIG. 3.

Although noise components such as jitter are contained in the delayed reference clock signal REFCLKD and the delayed feedback clock signal FBCLKD as illustrated in FIG. 4, the phase detection circuit 10 may output the phase detection signal PDOUT as a normal is value.

Figure 5:
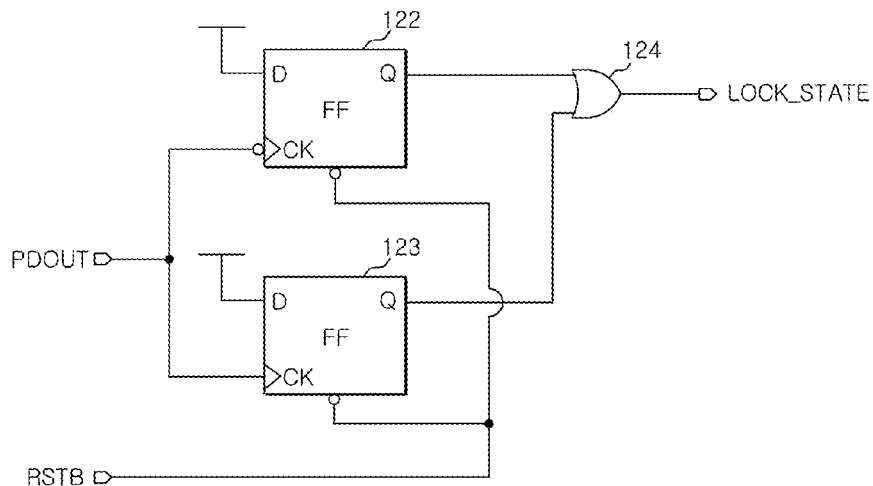
FIG. 5 is a circuit diagram illustrating the configuration of a lock state detector of FIG. 2.

Referring to FIG. 5, the locking state detection section 121 is configured to activate the lock completion signal LOCK_STATE in response to the transition of the phase detection signal PDOUT.

The locking state detection section 121 detects both the case in which the phase detection signal PDOUT transits from a high level to a low level and the case in which the phase detection signal PDOUT transits from a low level to a high level, and activates the lock completion signal LOCK_STATE.

The locking state detection section 121 includes a first flip-flop 122, a second flip-flop 123, and a logic gate 124.

The first flip-flop 122 has an input terminal connected to a power supply terminal and a clock terminal configured to receive the inverted phase detection signal PDOUT.

The second flip-flop 123 has an input terminal connected to the power supply terminal and a clock terminal configured to receive the phase detection signal PDOUT.

The first and second flip-flops 122 and 123 are reset by a reset signal RSTB.

The logic gate 124 is configured to perform an OR operation on output signals of the first and second flip-flops 122 and 123 and output the lock completion signal LOCK_STATE.

The operation of the synchronization circuit 100 according to an embodiment of the present invention will be described as follows.

The phase detection unit 10 compares the phase of the divided clock signal REFCLK/2 to the phase of the feedback clock signal FBCLK and generates the phase detection signal PDOUT, when the lock completion signal LOCK_STATE is deactivated (for example, low level).

The control unit 120 increases or decreases the delay time of the variable delay unit 110 according to the level of the phase detection signal PDOUT.

The phase of the feedback clock signal FBCLK changes in response to the increase or decrease in delay time of the variable delay unit 110.

Figure 6:
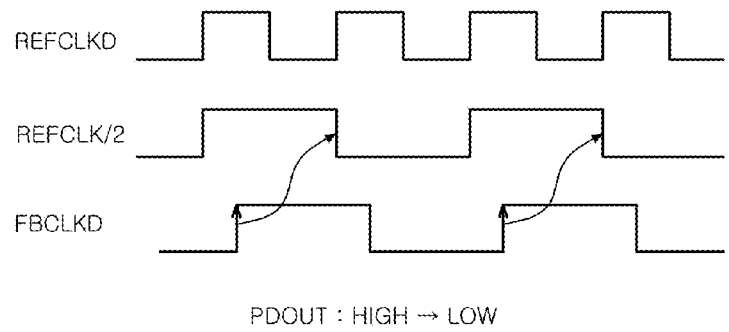
FIGS. 6 and 7 are waveform diagrams demonstrating the operation of the lock state detector of FIG. 5.

When the phase of the feedback clock signal FBCLK changes in response to the delay time depicted as FBCLKD in FIG. 6 in a state where the phase of the divided clock signal REFCLK/2 is locked, the phase detection signal PDOUT transits from a high level to a low level.

As the phase detection signal PDOUT transits from a high level to a low level, the first flip-flop 122 of FIG. 5 outputs a power supply level, i.e., a high level signal.

As the high level signal outputted from the first flip-flop 122 is outputted through the logic gate 124, the lock completion signal LOCK_STATE is activated.

Figure 7:
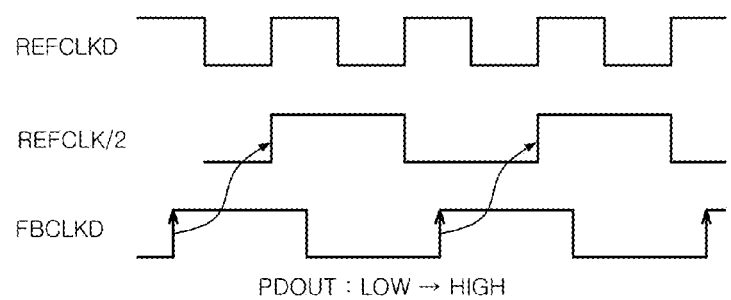

When the phase of the feedback clock signal FBCLK changes in response to the delay time depicted as FBCLKD in FIG. 7 in a state where the phase of the divided clock signal REFCLK/2 is locked, the phase detection signal PDOUT transits from a low level to a high level.

As the phase detection signal PDOUT transits from a low level to a high level, the second flip-flop 123 of FIG. 5 outputs a power supply level, i.e., a high level signal.

As the high level signal outputted from the second flip-flop 123 is outputted through the logic gate 124, the lock completion signal LOCK_STATE is activated.

When the lock completion signal LOCK_STATE is activated, the phase detection unit 10 compares the phase of the reference clock signal REFCLK to the phase of the feedback clock signal FBCLK and generates the phase detection signal PDOUT.

The control unit 120 increases or decreases the delay time of the variable delay unit 110 according to the level of the phase detection signal PDOUT.

After the lock completion signal LOCK_STATE is activated, the delay time of the variable delay unit 110 is minutely adjusted.

The phase of the feedback clock signal FBCLK also changes in response to the increase or decrease in delay time of the variable delay unit 110.

In an embodiment of the present invention, the feedback clock signal FBCLK is compared to the divided clock signal REFCLK/2 before the lock completion state, i.e., before the lock completion signal LOCK_STATE is activated, and compared to the reference clock signal REFCLK after the lock completion signal LOCK_STATE is activated, allowing for a stable phase detection.

Although a time point when the phase detection signal PDOUT transits to a specific level is not detected, because the transition of the phase detection signal PDOUT to a low level and a high level is determined as the lock completion, it is possible to guarantee a stable operation of the synchronization circuit.

While certain embodiments have been described above, it will be understood to those skilled in the art that the embodiments described are by way of example only. Accordingly, the semiconductor circuit described herein should not be limited based on the described embodiments. Rather, the semiconductor circuit described herein should only be limited in light of the claims that follow when taken in conjunction with the above description and accompanying drawings.

What is claimed is:

1. A phase detection circuit configured to generate a phase detection signal by comparing a divided clock signal obtained by dividing a first clock signal to a second clock signal during a deactivation period of a control signal, and generate the phase detection signal by comparing the first and second clock signals during an activation period of the control signal.

2. The phase detection circuit according to claim 1, wherein the phase detection circuit generates the phase detection signal depending on whether the phase of the second clock signal leads the phase of the divided clock signal or the first clock signal.

3. The phase detection circuit according to claim 1, wherein the control signal comprises a lock completion signal that defines whether a delay lock of a delay locked loop (DLL) or a phase lock of a phase locked loop (PLL) has been completed.

4. A phase detection circuit comprising:
a division section configured to generate a divided clock signal by dividing a first clock signal;
a multiplexing section configured to select and output the first clock signal or the divided clock signal in response to a control signal; and
a detection section configured to compare the phase of the output signal of the multiplexing section to a second clock signal and generate a phase detection signal.

5. The phase detection circuit according to claim 4, further comprising:
a first delay section configured to delay the first clock signal by a first delay time and provide the delayed first clock signal to the multiplexing section; and
a second delay section configured to delay the second clock signal by a second delay time and provide the delayed second clock signal to the detection section.

6. The phase detection circuit according to claim 5, wherein the first delay time comprises a delay time of a signal path passing through the division section.

7. The phase detection circuit according to claim 5, wherein the second delay time comprises a delay time of a signal path passing through the multiplexing section and either the division section or the first delay section.

8. The phase detection circuit according to claim 4, wherein the control signal comprises a lock completion signal that defines whether a delay lock of a DLL or phase lock of a PLL has been completed.

9. A synchronization circuit comprising:
a variable delay unit configured to generate a synchronization clock signal by delaying a reference clock signal by a varied delay time;
a feedback clock signal generation unit configured to receive the synchronization clock signal and generate a feedback clock signal;
a control unit configured to increase or decrease the delay time of the variable delay unit in response to a phase detection signal, and generate a lock completion signal in response to transition of the phase detection signal; and
a phase detection unit configured to generate the phase detection signal by comparing either the reference clock signal or the divided reference clock signal to the feedback clock signal in response to the lock completion signal.

10. The synchronization circuit according to claim 9, wherein the feedback clock signal generation unit comprises:
a division section configured to divide the synchronization clock signal; and
a replica delay section configured to delay an output signal of the division section by a preset delay time and output the delayed signal as the feedback clock signal.

11. The synchronization circuit according to claim 9, wherein the control unit detects both a case in which the phase detection signal transits from a high level to a low level and a case in which the phase detection signal transits from a low level to a high level, and activates the lock completion signal.

12. The synchronization circuit according to claim 9, wherein the control unit comprises a lock state detector.

13. The synchronization signal according to claim 12, wherein the lock state detector further comprises:
a first flip-flop having an input terminal connected to a power supply terminal, a clock terminal configured to receive the inverted phase detection signal, and a terminal connected to a reset signal;
a second flip-flop having an input terminal connected to the power supply terminal, a clock terminal configured to receive the phase detection signal, and a terminal connected to a reset signal; and
a logic gate configured to perform an OR operation on output signals of the first and second flip-flops and output the lock completion signal.

14. The synchronization circuit according to claim 9, wherein the phase detection unit comprises:
a division section configured to generate a divided clock signal by dividing the reference clock signal;

a multiplexing section configured to select and output the reference clock signal or the divided clock signal in response to the lock completion signal; and a detection section configured to compare the phase of the output signal of the multiplexing section to the feedback clock signal and generate the phase detection signal.

15. The synchronization circuit according to claim 14, wherein the phase detection unit further comprises:

a first delay section configured to delay the reference clock signal by a first delay time and provide the delayed signal to the multiplexing section; and a second delay section configured to delay the feedback clock signal by a second delay time and provide the delayed signal to the detection section.

16. The synchronization circuit according to claim 15, wherein the first delay time comprises a delay time of a signal path passing through the division section.

17. The synchronization circuit according to claim 15, wherein the second delay time comprises a delay time of a signal path passing through the multiplexing section and either the division section or the first delay section.

* * * * *